(12) United States Patent
Dwelly et al.

(10) Patent No.: US 7,352,226 B2
(45) Date of Patent: Apr. 1, 2008

(54) VERSATILE ATTENUATOR

(75) Inventors: Wesley Dwelly, Tucson, AZ (US); Vinh N. Adams, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 142 days.

(21) Appl. No.: 10/909,569

(22) Filed: Aug. 2, 2004

(65) Prior Publication Data

US 2006/0022738 A1    Feb. 2, 2006

(51) Int. Cl.
  *H03L 5/00*    (2006.01)
(52) U.S. Cl. ..................................... 327/308
(58) Field of Classification Search ................ 327/308
  See application file for complete search history.

(56) References Cited

U.S. PATENT DOCUMENTS

| 5,161,170 | A | | 11/1992 | Gilbert et al. ............... 375/345 |
|---|---|---|---|---|
| 5,610,604 | A | * | 3/1997 | Leacock et al. ............. 341/138 |
| 5,893,024 | A | * | 4/1999 | Sanders et al. ............. 725/125 |
| 5,994,965 | A | * | 11/1999 | Davis et al. ................. 330/295 |
| 6,061,171 | A | * | 5/2000 | Taylor et al. ............. 359/337.1 |
| 6,331,832 | B1 | | 12/2001 | Rushing ...................... 341/139 |
| 6,388,518 | B1 | * | 5/2002 | Miyatani .................... 330/149 |
| 6,587,069 | B2 | * | 7/2003 | Ringwald et al. ............. 342/30 |
| 6,714,073 | B2 | * | 3/2004 | Suto et al. ................... 330/149 |
| 6,995,613 | B2 | * | 2/2006 | Meck .......................... 330/297 |
| 7,106,246 | B1 | * | 9/2006 | Lindell ........................ 342/51 |
| 2002/0191710 | A1 | * | 12/2002 | Jeckeln et al. .............. 375/296 |
| 2003/0156666 | A1 | | 8/2003 | Nichols ....................... 375/345 |

FOREIGN PATENT DOCUMENTS

DE    102-15-798    10/2003

* cited by examiner

*Primary Examiner*—Quan Tra
(74) *Attorney, Agent, or Firm*—John J. Horn

(57) ABSTRACT

A versatile attenuator. The versatile attenuator includes a first mechanism for receiving an input signal. A second mechanism measures the input signal and provides a signal-level indication in response thereto. A third mechanism selectively attenuates the input signal when the signal-level indication surpasses a predetermined threshold and provides an attenuated signal in response thereto. In a more specific embodiment, the third mechanism further provides attenuation information. An additional mechanism then employs the attenuation information and a computer to selectively adjust an output signal of a circuit connected between the computer and the third mechanism to accommodate effects that attenuation of the input signal by the third mechanism has on the output signal.

12 Claims, 3 Drawing Sheets

VERSATILE ATTENUATOR

BACKGROUND OF THE INVENTION

1. Field of Invention

This invention relates to electrical and electronic circuits and systems. Specifically, the present invention relates to systems and methods for improving the dynamic range of circuits, such as radar and Radio Frequency (RF) communications receivers.

2. Description of the Related Art

Receivers are employed in various demanding applications including radar, ladar, and microwave sensing systems. Such applications demand receivers that can accommodate various signal magnitudes including both faint and intense signals without causing signal distortion, such as spurs, clipping, or intermodulation distortion. This necessitates receivers with high dynamic ranges, preferably above 100 dB. High dynamic range receivers are particularly important in communications systems and projected munition targeting applications, where sufficient system resolution and signal detection capability are required to extract desired signals from background noise and other signal clutter.

Conventionally, receiver dynamic range is increased by improving receiver components, such as Analog-to-Digital Converters (ADC's). Unfortunately, dynamic ranges of ADC's are improving somewhat slowly. Furthermore, high dynamic range ADC's require accompanying high-performance components, such as mixer/amps, which may be prohibitively expensive or unavailable. Accordingly, conventional receiver design methods are often incapable of achieving receiver dynamic ranges above 60 dB.

To enhance receiver performance, receive signal levels may be adjusted to reduce false signal defects (spurs), receiver saturation, and signal clipping caused by excessively large signals. Video levels are lowered so that signal spikes do not saturate the ADC or accompanying components. Unfortunately, lowering video levels may compromise receiver ability to detect faint signals and to extract desired signals from background noise or ground clutter.

To address problems in the detection of faint signals in intense signal environments, Automatic Gain Control circuits (AGC's) are often employed for automatically controlling input video levels. AGC's may reduce signal spurs caused by excessively large signals. An AGC automatically adjusts average receive signal levels to avoid frequent ADC saturation and associated signal spurs, which compromise receiver performance. Unfortunately, valuable signal magnitude information is often lost by AGC video adjustment. For example, the original magnitude of a large attenuated input signal may be unknown after attenuation, and faint signals among large signals may become undetectable. AGC's typically do not increase the effective dynamic range of accompanying ADC's.

Alternatively, sliding scale attenuators are employed to improve receiver performance. An exemplary sliding scale attenuator includes three banks, each bank having three voltage comparators. The banks determine signal attenuation values to facilitate ADC operation. The sliding scale attenuator selects a desired signal attenuation from nine calculated attenuator values, one for each comparator, based on predetermined selection rules. Unfortunately, the sliding scale attenuator is relatively slow, cannot optimize the dynamic range of the ADC, and causes loss of signal magnitude information.

Hence, a need exists in the art for an efficient system and method for improving the dynamic range of a circuit without necessitating the loss of signal magnitude information.

SUMMARY OF THE INVENTION

The need in the art is addressed by the versatile attenuation system of the present invention. In the illustrative embodiment, the inventive system is adapted for use with radar systems and wireless communications systems. The attenuation system includes a first mechanism for receiving an input signal. A second mechanism measures the input signal and provides a signal-level indication in response thereto. A third mechanism selectively attenuates the input signal when the signal-level indication surpasses a predetermined threshold and provides an attenuated signal in response thereto.

In a specific embodiment, the third mechanism further includes a fourth mechanism for providing attenuation information. A fifth mechanism employs the attenuation information and a computer to selectively adjust an output signal of a circuit connected between the computer and the third mechanism to reverse previously-applied attenuation.

In a more specific embodiment, the second mechanism includes a signal-level detector and a coupler. The coupler directs a first portion or version of the input signal to the signal-level detector and passes a second portion or version of the input signal to a matched-phase attenuator. A sixth mechanism compares the signal-level indication, which is output by the signal-level detector, to the predetermined threshold and provides an attenuation flag signal in response thereto to the attenuator. The sixth mechanism employs a comparator that is associated with one or more latches configured to ensure that attenuation occurs at particular intervals corresponding to clock cycles during which the threshold ($V_T$) has been exceeded as indicated by the attenuation flag. The system includes a delay circuit that is positioned to receive the second version of the input signal. The delay circuit delays the second version of the input signal by an amount approximately equal to a signal delay time experienced by the first version of the input signal between the coupler and the attenuator.

In the illustrative embodiment, the circuit for which the system extends the effective dynamic range includes an Analog-to-Digital Converter (ADC) and/or a mixer/amp. The predetermined threshold is set at or below a maximum signal level that the ADC can accommodate before clipping or other undesirable distortion or signal effects occur, such as approximately 3 dB below the maximum signal level.

The novel design of one embodiment of the present invention is facilitated by the second and third mechanisms, which selectively attenuate portions of the receive signal characterized by signal levels that would otherwise exceed the dynamic range of the accompanying ADC or other circuit. By flagging portions of the receive signal for attenuation at particular intervals and incorporating a sufficient delay in the receive signal so that the receive signal and the attenuation flags are synchronous, attenuation can be readily removed by a computer from the signal after processing by the ADC or other circuit. This greatly enhances the effective dynamic range of the accompanying circuit. Attenuation factors and phase information are maintained and forwarded to the computer to facilitate performing reverse attenuation on the receive signal. Hence, valuable signal magnitude and phase information are maintained while effective circuit dynamic range capabilities are enhanced. The unique system acts as a coherent look-ahead attenuator for extending the dynamic range of a circuit.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
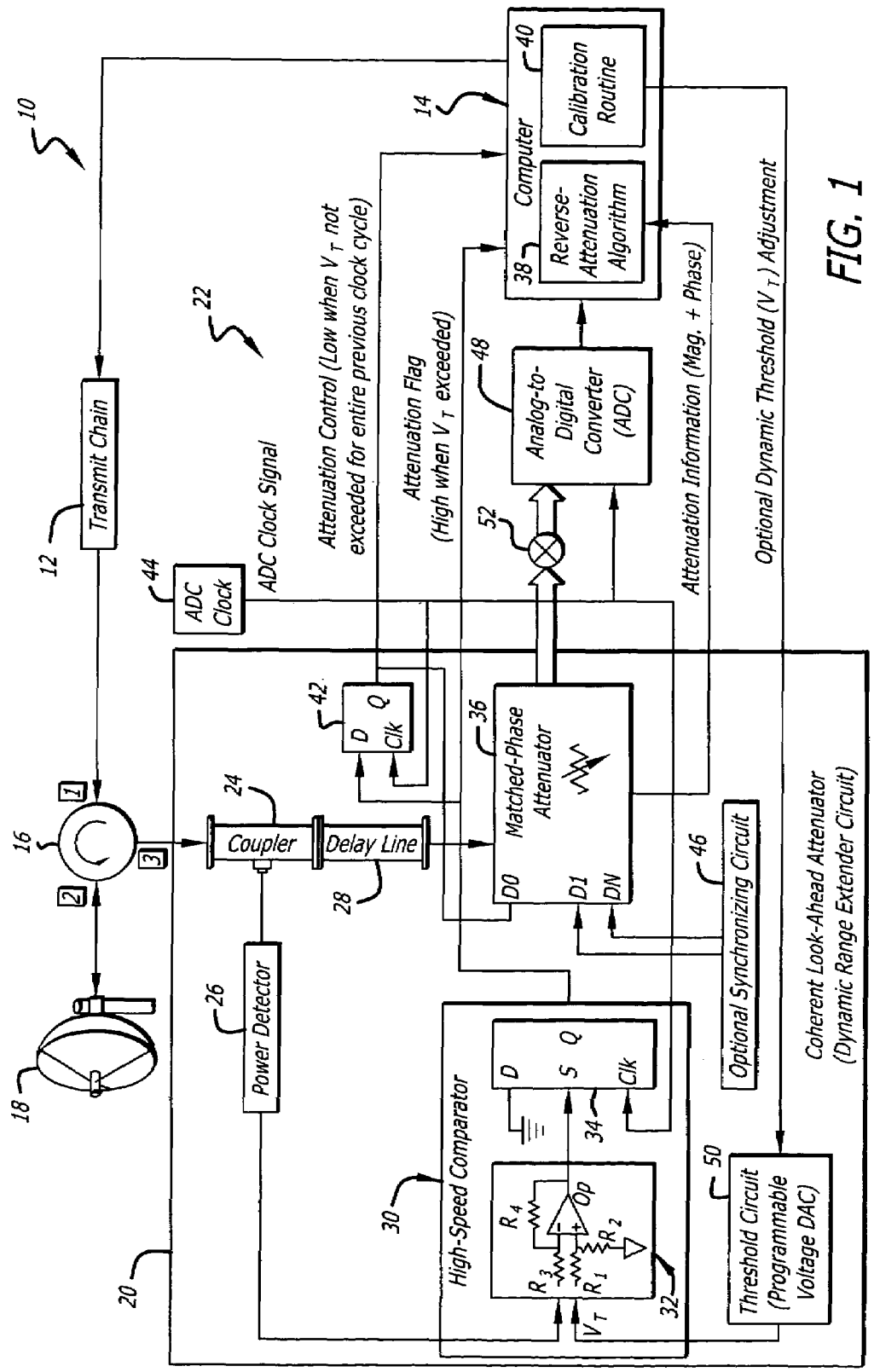
FIG. 1 is a diagram of a transceiver employing an efficient coherent look-ahead attenuator according to an illustrative embodiment of the present invention.

FIG. 1 is a diagram of a transceiver 10 employing an efficient coherent look-ahead attenuator 20 according to an embodiment of the present invention. For clarity, various features, such as power supplies, automatic gain control circuits, computer operating systems, and so on, have been omitted from the figures. However, those skilled in the art with access to the present teachings will know which components and features to implement and how to implement them to meet the needs of a given application.

In the present specific embodiment, the transceiver 10 is adapted for use in radar applications. The transceiver 10 includes a transmit chain 12 that receives input from a computer 14 (signal processor) and provides corresponding output to a circulator 16. The circulator 16 selectively provides output from the transmit chain 12 to an antenna 18 and provides output from the antenna 18 to a directional coupler 24 of a coherent look-ahead attenuator 20, which acts as a dynamic range extender circuit. The coherent look-ahead attenuator 20 further includes a power detector 26, a delay line 28, a high-speed comparator 30, a matched-phase attenuator 36, a second Delay (D) flip flop 42, an optional synchronizer circuit 46, and a threshold circuit 50, which may be a programmable-voltage Digital-to-Analog Converter (DAC).

The directional coupler 24 provides coupled energy from a received signal along a first path to the power detector 26 and along a second path through the delay line 28 to the matched-phase attenuator 36. The first path further includes the high-speed comparator 30, which is connected between the matched-phase attenuator 36 and the power detector 26. The power detector 26 receives input from the directional coupler 24 and provides output to a comparing circuit 32 within the high-speed comparator 30. The comparing circuit 32 provides input to a first D flip-flop 34, Set pin (S), which is also incorporated within the high-speed comparator 30 in the present specific embodiment.

The latch 34 receives a clock input from an Analog-to-Digital Converter (ADC) clock 44. A data output (Q), which represents an attenuation flag, is input to the computer 14 and to a data input (D) of the D flip-flop 42. The D flip-flop 42 receives a clock input from the ADC clock 44. A data output (Q) of the D flip-flop 42 acts as an attenuation-control signal flag and is input to the Matched-Phase Attenuator 36 and to the computer 14. The ADC clock 44, which clocks the D flip-flop 42, also provides a clock signal input to the ADC 48.

The threshold circuit 50 receives ADC limit information and optional dynamic threshold-adjustment information from a calibration routine 40 running on the computer 14. The threshold circuit 50 provides a voltage threshold ($V_T$) as input to the comparing circuit 32 of the high-speed comparator 30.

The calibration routine 40 provides accurately phase-matched and amplitude-matched corrections to the ADC data and optionally provides threshold adjustments to threshold circuit 50. The calibration routine 40 may run additional algorithms and provide additional timing input to various additional components of the coherent look-ahead attenuator 20, such as the matched-phase attenuator 36 and optional synchronizing circuit 46, to facilitate overall coherent operation of the transceiver 10.

In the present specific embodiment, the matched-phase attenuator 36 provides a selectively attenuated receive signal to an optional mixer/amp 52, which provides analog input to the ADC 48. The matched-phase attenuator 36 also provides attenuation information to a reverse-attenuation algorithm 38 running on the computer 14. The attenuation information includes receive-signal magnitude and phase information associated with attenuated portions of the receive signal. The attenuation information is sufficient to enable the reverse-attenuation algorithm 38 to reverse attenuation previously applied to the receive signal by the matched-phase attenuator 36.

The various modules 20, 44, 52, and 48 are considered part of a receive chain 22 of the transceiver 10. In the present embodiment, the transceiver system 10 is adapted for use in pulsed radar applications.

In operation, the computer 14 forwards a digital radar signal to the transmit chain 12, which provides a corresponding analog transmit signal to the circulator 16 in response thereto. The circulator 16 then forwards the analog transmit signal to the antenna 18, which transmits the analog signal toward a scene (now shown). The resulting wireless transmit signal reflects from the scene, producing a return signal. In a radar system, the transmit signal is often a pulsed analog signal, which yields pulsed return signals.

The wireless return signal is detected by the antenna 18, converted to an electrical receive signal, and then forwarded to the circulator 16. The circulator 16 then forwards the receive signal to the directional coupler 24 of the coherent look-ahead attenuator 20. The directional coupler 24 diverts a first portion or copy of the receive signal to the power detector 26 and forwards a second portion or copy of the receive signal to the matched-phase attenuator 36 via the delay line 28.

The power detector 26 measures energy levels of the coupled receive signal and provides a voltage power-level indication as input to the high-speed comparator 30 in response thereto. The high-speed comparator 30 employs the comparing circuit 32 to compare the power-level indication output by the power detector 26 with the predetermined voltage threshold ($V_T$).

In the present specific embodiment, the predetermined voltage threshold ($V_T$) corresponds to a signal power level that is approximately 3 dB below the maximum power level that the mixer/Amp 52 and ADC 48 can accommodate without introducing undesirable nonlinear effects, such as pulse skewing and intermodulation distortion. The threshold circuit 50 may dynamically adjust the threshold ($V_T$) in response to threshold-adjustment signals received from the calibration routine 40 running on the computer 14. The threshold circuit 50 may employ dynamic range limit parameters from the ADC 48 to facilitate computing the threshold ($V_T$). The threshold circuit 50 may also employ dynamic range limit parameters from the mixer/amp 52 to determine the threshold ($V_T$).

Those skilled in the art will appreciate that thresholds corresponding to power levels other than 3 dB below maximum power levels may be employed without departing from the scope of the present invention. Furthermore, the coherent look-ahead attenuator 20 may be positioned in front of circuits other than ADC's and/or mixers without departing from the scope of the present invention. The coherent look-ahead attenuator 20 may extend the effective dynamic range of virtually any circuit component(s) placed between the coherent look-ahead attenuator 20 and the computer 14.

In the present specific embodiment, the comparing circuit 32 in the high-speed comparator 30 employs four resistors R1-R4 and an operational amplifier (Op) in a comparator configuration. The comparing circuit 32 compares the receive signal power level indication output by the power detector 26 to the threshold ($V_T$) and outputs a comparison signal in response thereto. The threshold comparison signal is provided as a Set (S) input to the latch 34. The latch 34 and the D flip-flop 42 operate according to the following state table:

TABLE 1

D Flip Flop with Set and Reset

| Inputs | | | | Outputs | | |
| --- | --- | --- | --- | --- | --- | --- |
| Reset (R) | Set (S) | Clock (Clk) | Data (D) | Q | Q Bar | Mode |
| 0 | 1 | X | X | 1 | 0 | Asynchronous set |
| 1 | 0 | X | X | 0 | 1 | Asynchronous reset |
| 1 | 1 | X | X | 1 | 1 | Undetermined |
| 0 | 0 | ↑ | 1 | 1 | 0 | Load "1" |
| 0 | 0 | ↑ | 0 | 0 | 1 | Load "0" |
| 0 | 0 | — | X | nc | nc | Hold |

In Table 1, above '0' represents a low state, while '1' represents a high voltage state. Table 1 lists the output (Q and Q Bar) of the latch 34 for various combinations of S, R, Clk, and D input states. The rising edge of the ADC clock signal from the ADC clock 44 may transition the latch 34 and the flip-flop 42 to the next state. However, the latch 34 is configured so that a high state occurring at the S input will appear at the output (Q) of the latch 34 without requiring clocking of the latch 34 by the ADC clock 44. However, for the output of the latch 34 to transition to a low state (Q=0), the input (D) from the comparing circuit 32 must be in a low state, and the rising edge of the ADC clock signal must be detected by the latch 34. The exact details of the operation of the latch 34 are application-specific and may be adjusted to meet the needs of a given application without departing from the scope of the present invention.

The output (Q) represents an attenuation flag that is high when the voltage threshold ($V_T$) is exceeded by a corresponding portion of the receive signal and is low otherwise. When the threshold ($V_T$) has been exceeded, the output from the comparing circuit 32, which is input to the latch 34, represents a high voltage state (D =1). Accordingly, the output (Q) of the latch 34 immediately transitions to a high state. The output state (Q) will remain high for the remainder of the clock cycle during which the output state transitioned to a high state. Particular ADC samples associated with instances when the threshold ($V_T$) has been exceeded may be cleared and then later reconstructed by the reverse-attenuation algorithm 38 as discussed more fully below.

The output (Q) of the flip-flop 42 only transitions to the next state in response to the rising edge of the ADC clock signal output from the ADC clock 44. The output (Q) of the flip-flop 42 represents an attenuation control signal. The attenuation control signal transitions to a low state only when the maximum (or minimum) signal level was not exceeded during the entire previous clock cycle. If the threshold ($V_T$) has been exceeded, as indicated by a high state at the output of the latch 34 (attenuation flag set), during any portion of the previous clock cycle, the output of the flip-flop 42 transitions to a high state. The matched-phase attenuator 36 will employ the output (Q) of the flip-flop 42 to ensure that attenuation is applied to the receive signal as output from the delay line 28 for the entire clock cycle during which the threshold ($V_T$) has been exceeded. This facilitates reverse attenuation performed by the reverse-attenuation algorithm 38 running on the computer 14.

The delay line 28 imparts a delay to the portion of the receive signal traveling from the directional coupler 24 to the matched-phase attenuator 36. In the present specific embodiment, the delay is approximately equivalent to the signal delay between the input of the power detector 26 and the output of the high-speed comparator 30. The signal delay represents the sum of the delays introduced by circuit components 26, 30-34 along the first path. Depending on the particular application or implementation, this delay may include the delay associated with the flip-flop 42.

The delay is sufficient to ensure that the attenuation signal output from the high-speed comparator 30 is approximately synchronous with the receive signal output from the delay line 28, such that high attenuation flag states coincide with portions of the receive signal that should be attenuated. Alternatively, the delay line 28 introduces a delay that is slightly longer than the sum of the delays along the first path between the input of the power detector 26 and the output of the high-speed comparator 30.

The matched-phase attenuator 36 attenuates portions of the receive signal input via the delay line 28 that coincide with high values of the attenuation Ctrl (Q) output from the D flip-flop 42. The attenuated portions of the receive signal are those portions that contain energy that exceed the predetermined threshold. Attenuation is applied to specific blocks that are integral multiples of the ADC clock signal cycle length. Attenuation also occurs approximately in phase with the ADC clock signal.

Accordingly, when a large return is received by the receive chain 22, the return is appropriately attenuated by the coherent look-ahead attenuator 20 before being passed to the mixer/Amp 52 and ADC 48. The signal path between the directional coupler 24 and the matched-phase attenuator 36 is sufficiently delayed by the precision delay line 28 to allow the coherent look-ahead attenuator 20 to switch and settle before the return reaches the matched-phase attenuator 36.

In the present specific embodiment, the match-phase attenuator 36 applies one or more predetermined attenuation factors to the receive signal from the delay line 28 to facilitate attenuation. The attenuation factors and timing information, i.e., phase information indicating when the attenuation factors were applied is forwarded to the reverse-attenuation algorithm 38 running on the computer 14. The matched-phase attenuator 36 is built with sufficiently accurate phase tolerances and a minimum number of attenuator states required to meet the needs of a given application.

Alternatively, the matched phase attenuator 36 may map portions of the receive signal associated with instances wherein the threshold ($V_T$) has been exceeded into one state. In this case, the matched phase attenuator 36 forwards original signal level and phase information to the reverse-attenuation algorithm 38 before mapping portions of the signal to the attenuated state.

Exact details of the matched-phase attenuator 36 are application-specific. Those skilled in the art with access to the present teachings will know how to utilize the present teachings to implement an attenuator 36 to meet the needs of a given application without undue experimentation. Suitable PIN Diode or GaAs FET fast-switching phase-and-amplitude-repeatable attenuators are readily available and may be employed to implement the matched-phase attenuator 36 without undue experimentation.

After the receive signal is attenuated by the matched phase attenuator 36 at specific sampling intervals, i.e., ADC clock cycle intervals, the selectively attenuated receive signal is forwarded to the mixer/amp 52. The selectively attenuated receive signal exhibits signal levels that to not exceed the dynamic ranges of the mixer/amp 52 or the ADC 48. After processing by the mixer/amp 52 and conversion to a digital signal via the ADC 48, the resulting selectively attenuated digital receive signal is forwarded to the computer 14. The computer 14 then employs the reverse-attenuation algorithm 38 and the attenuation information (original signal magnitude and phase) to reconstitute the attenuated portions of the digital receive signal.

In one embodiment, the reverse-attenuation algorithm 38 simply multiplies appropriate portions of the digital receive signal by attenuation factors received from the matched-phase attenuator 36 at appropriate instances in time. The exact details of the reverse-attenuation algorithm 38 are application-specific and depend on the implementation of the matched-phase attenuator 36. Those skilled in the art with access to the present teachings will now how to implement the reverse-attenuation algorithm 38 to meet the needs of a given application without undue experimentation.

In the present specific embodiment, the synchronizing circuit 46 receives the ADC clock signal as input and provides optional synchronizing output to the matched-phase attenuator 36. The synchronizing output is high for the duration of the ADC clock cycle during which the attenuation flag is set. One or more delays (not shown) may be added at the output of the latch 34 to facilitate operation of the synchronizing circuit 46. Those skilled in the art with access to the present teachings may readily implement the synchronizing circuit 46 without undue experimentation. Use of an optional synchronizing circuit may obviate the need for the flip-flop 42 and vice versa. A synchronizing circuit may also be employed as a blanking circuit that receives input from the computer 14 to selectively reset the states of the matched-phase attenuator 36.

Various components and modules of the coherent look-ahead attenuator 20 may be replaced with alternative modules without departing from the scope of the present invention. For example, high-speed comparator 30 may be replaced with a latch or flash ADC. Selected bits of a Flash ADC may be employed, instead of the threshold circuit 50, to produce the threshold ($V_T$). Furthermore, the power detector 26 may be implemented via a log amplifier. Furthermore, the directional coupler 24 may be replaced with a different mechanism, such as a signal replicator or tap that provides a first copy of the receive signal to the power detector 26 and a second copy to the delay line 28. This is option is an alternative to simply providing a coupled portion of the receive signal to the power detector 26 and forwarding the remaining portion of the receive signal to the delay line 28. Furthermore, the functionality of the power detector 26 may be incorporated directly into the directional coupler 24. In addition, the power detector 26 may be replaced with another type of signal-level detector or signal-magnitude detector. The voltage threshold ($V_T$) signal output from the threshold circuit 50 may be a current signal, or other type of signal sufficient to provide a value to the high-speed comparator 30 for comparison purposes.

The gain of the overall system 10 is initially calibrated for a particular application. Various amplifiers and/or automatic gain control circuits (not shown) may be employed to set the gain to a desired level. The threshold ($V_T$) for the matched-phase attenuator 20 is adjusted accordingly so that the threshold corresponds to a power level that is approximately 3 dB below full scale.

In an alternative embodiment, wherein the high-speed comparator 30 is implemented via a flash ADC, the threshold circuit 50 and accompanying programmable-voltage DAC may be unnecessary. Furthermore, the high-speed comparator 30 may be replaced with a signal level detector or other device that automatically outputs a certain state (attenuation flag) when the input power levels reach predetermined levels. In this case, the power detector 26 may be omitted. One could employ planar diodes with fast rise times to implement the signal level detector.

In the present specific embodiment, the matched-phase attenuator 36 is implemented via high-speed components, such as GaAs or SiGe pn junctions or resonant tunneling devices. Faster circuit components may increase transceiver bandwidth. The high-speed electronics enable the system 10 to attenuate large signal returns in real time on an per ADC-sample basis while maintaining phase coherency and linear performance.

Each signal sample taken by the ADC 48 is flagged by the attenuation flag output from the D flip-flop 42 to indicate to the computer 14 that the corresponding data should be multiplied by the attenuation value. The attenuator 20 is also calibrated with accurate phase tolerances to facilitate coherent integration. Those skilled in the art with access to the present teachings may readily calibrate the system 10 without undue experimentation.

The coherent look-ahead attenuator 20 acts as a dynamic range extender circuit applicable to extending the dynamic range of virtually any circuit that employs an analog-to-digital converter or other electronic component that has a specific maximum signal range. Furthermore, the coherent look-ahead attenuator 20 may relieve overall gain tolerances of the receive chain 22.

Unlike a conventional AGC, which adjusts receiver gain based on an average energy of multiple received signal pulses; loses valuable signal magnitude information; and does not increase the dynamic range capabilities of the accompanying receiver, the coherent look-ahead attenuator 20 employs novel sample-by-sample attenuation; conserves important signal magnitude information; and increases the dynamic range capabilities of the accompanying receive chain 22 by extending dynamic range capabilities of the mixer/amp 52 and ADC 48.

Instead of attenuating both small returns and large returns via an AGC circuit, the coherent look-ahead attenuator 20 does not necessitate attenuation of the small returns. Accordingly, potentially valuable information contained in very faint signals is maintained. Similarly, unlike with an AGC circuit, the original magnitude of large received pulses is maintained by the coherent look-ahead attenuator 20 of FIG. 1.

Figure 2:
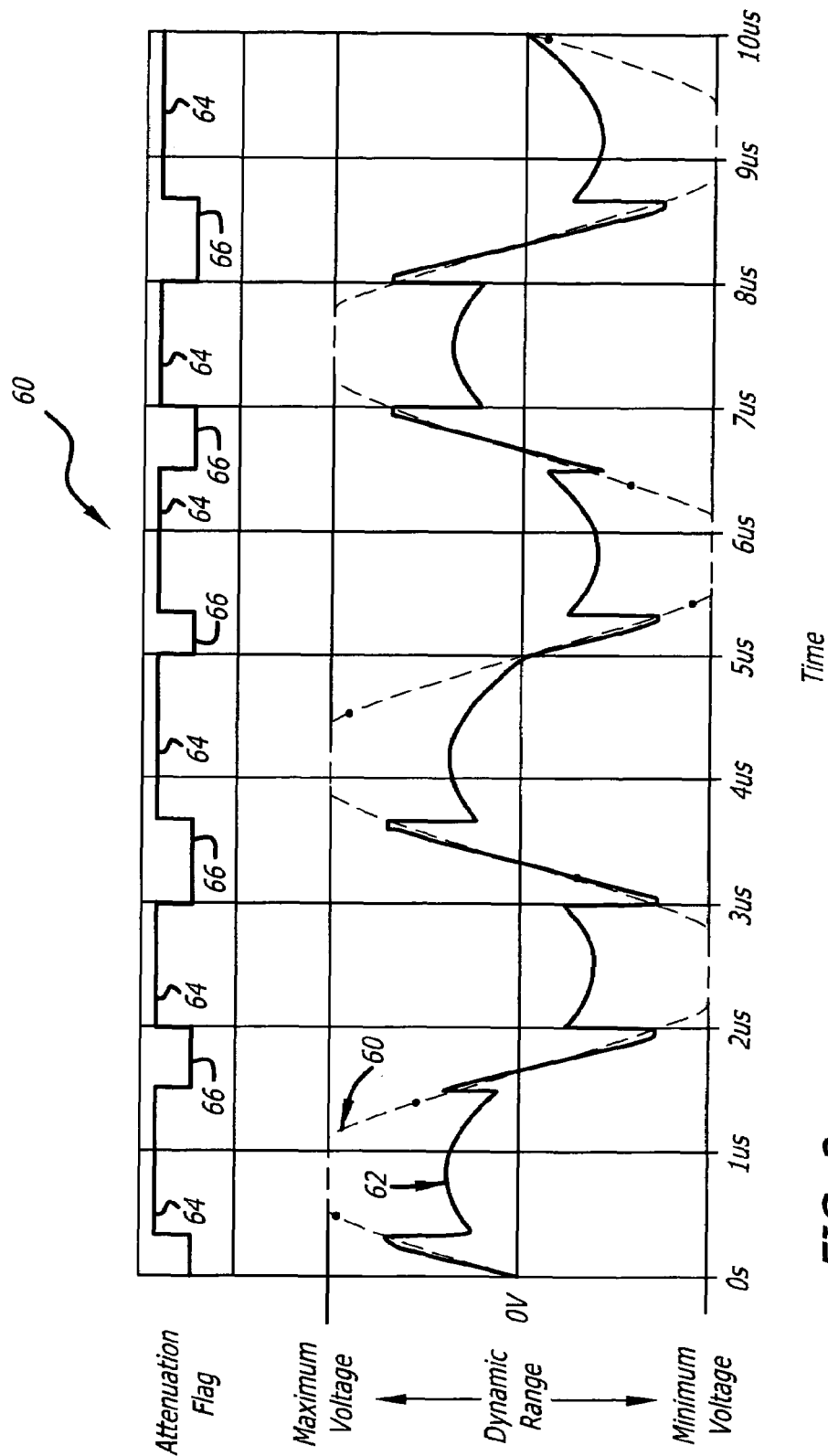
FIG. 2 is a graph illustrating effects of the coherent look-ahead attenuator of FIG. 2 on an exemplary signal.

FIG. 2 is a graph 60 illustrating effects of the coherent look-ahead attenuator 20 of FIG. 2 on an exemplary receive signal 60. The receive signal 60 contains voltage swings that exceed the maximum and minimum signal levels, i.e., exceed the dynamic range capabilities of the ADC 48 and/or mixer/amp 52.

With reference to FIGS. 1 and 2, the coherent look-ahead attenuator 20 attenuates portions of the receive signal 60 that have magnitudes that exceed the threshold $V_T$, yielding the selectively attenuated signal 62. Accordingly, portions of the receive signal 60 that exceed dynamic range limits of the ADC 48 and/or mixer/amp 52 are attenuated. The factors by which portions of the selectively attenuated signal 62 are attenuated are forwarded to the reverse-attenuation algorithm 38 to enable signal reconstruction after processing by the mixer/amp 52 and ADC 48. The attenuation signal indicates to the reverse-attenuation algorithm 38 when to undo attenuation.

Note that attenuation flag is appropriately synchronized relative to the receive signal 60, i.e., the attenuation flag and the receive signal 60 are coherent. Hence, the attenuator 20 is called a coherent look-ahead attenuator.

Figure 3:
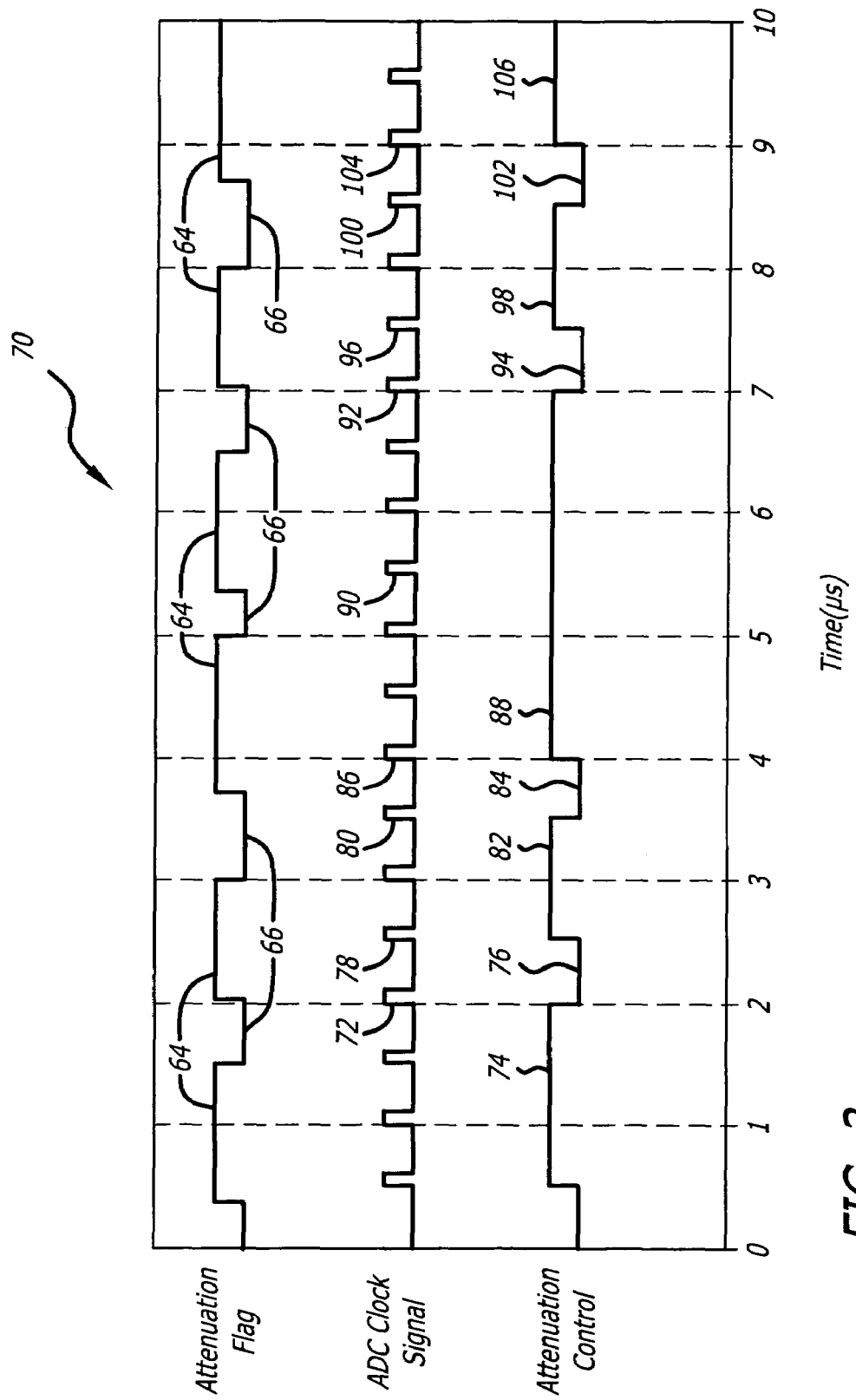
FIG. 3 is a timing diagram illustrating exemplary control signal relationships for the coherent look-ahead attenuator of FIG. 2.

FIG. 3 is an timing diagram illustrating exemplary control signal relationships for the coherent look-ahead attenuator 20 of FIG. 2. With reference to FIGS. 1 and 3, the attenuation flag as output from the high-speed comparator 30 exhibits high states 64 during periods when the matched-phase attenuator 36 is expecting to attenuate the receive signal output from the delay line 28. The attenuation flag transitions to a low state in response to rising edges of the ADC clock signal when the output of the comparing circuit 32 is low, which occurs when the receive signal level indication output by the power detector 26 does not surpass the threshold ($V_T$).

The attenuation control signal as output by the flip-flop 42 transitions to a high state in response to the rising edge of the ADC clock signal when the attenuation flag is high. Similarly, the attenuation control signal transitions to a low state in response to a rising edge of the ADC clock signal when the attenuation flag is low. This occurs only when the attenuation flag has been low for an entire clock cycle. Hence, the attenuation control signal is low only when the receive signal has not exceeded a predetermined signal level for the entire previous clock cycle. The matched-phase attenuator 36 may employ this information to ensure that attenuation is applied to the entire clock cycle during which the threshold ($V_T$) has been exceed. If the maximum attenuation was not exceeded during an entire clock cycle, then attenuation is not applied to that clock cycle by the matched-phase attenuator 36. Otherwise, attenuation is applied, and the attenuation factor and associated signal phase information are then forwarded to the computer 14 to enable reverse attenuation.

For example, during a first rising edge 72 of the ADC clock signal, the attenuation flag has been in a low flag state 66 for the entire previous clock cycle (measured from rising edge to rising edge). Accordingly, the attenuation control signal transitions from a first high state 74 to a first low state 76. A second rising edge 78 clocks the high attenuation flag state 64 into the flip-flop 42, which transitions the attenuation control signal from the first low state 76 to a second high state 82 resulting in a second high state 82 in the attenuation control signal. A third exemplary rising edge 80 of the ADC clock signal transitions the attenuation control signal from the second high state 82 to a second low state 84. Note that the attenuation flag has been in a low flag state 66 for the entire duration of the clock cycle preceding the third exemplary rising edge 80, of the ADC clock signal.

Similarly, a fourth exemplary rising edge 86 of the ADC clock signal transitions the attenuation control signal to a third high state 88. Note that a fifth exemplary rising edge 90 does not transition the attenuation control signal to low state, since the attenuation flag was not low for the entire previous clock cycle. ADC clock rising edges 92, 96, 100, and 104 cause the attenuation control signal to exhibit a third low state 94, a fourth high state 98, a fourth low state 102, and a fifth high state 106, respectively, according to the state of the attenuation flag. The attenuation control signal facilitates enabling the coherent look-ahead attenuator 20 to perform attenuation on a per sample basis, which is per clock-cycle basis in the present embodiment.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

Accordingly,

What is claimed is:

1. An attenuation system comprising:
   first means for receiving an input signal;
   second means for measuring said input signal and providing a signal-level indication in response thereto, said second means including a signal-level detector and a coupler, said coupler directing a first version of said input signal to said signal-level detector and passing a second portion or version of said input signal to an attenuator;
   third means for selectively attenuating said input signal when said signal-level indication surpasses a predetermined threshold and providing an attenuated signal in response thereto, said third means including means for providing attenuation information; and
   fourth means for digitizing said attenuated signal;
   fifth means for employing said attenuation information to selectively adjust an output signal of a circuit connected between said third means and said fifth means to accommodate effects that attenuation of said input signal by said third means has on said output signal;
   said third means further including sixth means for comparing said signal-level indication which is output by said signal-level detector, to said predetermined threshold and providing an attenuation flag signal in response thereto to said attenuator, said sixth means including a comparator, said comparator being associated with one or more latches configured so that attenuation occurs at particular intervals corresponding to clock cycles during which said predetermined threshold has been exceeded as indicated by said attenuation flag.

2. The system of claim 1 wherein said fifth means includes a signal processor.

3. The system of claim 1 further including a delay circuit positioned to receive said second version of said input signal, said delay circuit sufficient to delay said second version of said input signal by an amount corresponding to a signal delay time experienced by said first version of said input signal between said coupler and said attenuator.

4. The system of claim 3 wherein said delay circuit is a delay line capable of imparting a sufficient delay to said second version of said input signal so that said attenuation flag signal and said second version of said input signal are approximately synchronous.

5. The system of claim 3 wherein said signal delay time includes the sum of signal delays caused by said signal-level detector and said comparator.

6. The system of claim 1 wherein said fourth means is an Analog-to-Digital Converter (ADC).

7. The system of claim 6 wherein said fourth means further includes a mixer/amp.

8. The system of claim 7 wherein said predetermined threshold is at or below a maximum signal level that said ADC can accommodate before clipping or other undesirable distortion or signal effects occur.

9. The system of claim 8 wherein said predetermined threshold is approximately 3 dB below said maximum signal level.

10. An attenuation system comprising:

first means for receiving an input signal;

second means for measuring said input signal and providing a signal-level indication in response thereto, said second means including means for effecting said attenuation at particular intervals corresponding to clock cycles during which said predetermined threshold has been exceeded, said second means including a signal-level detector and a coupler, said coupler directing a first version of said input signal to said signal-level detector and passing a second portion or version of said input signal to an attenuator;

third means for selectively attenuating said input signal when said signal-level indication surpasses a predetermined threshold and providing an attenuated signal in response thereto, said third means including means for providing attenuation information, said third means further including sixth means for comparing said signal-level indication, which is output by said signal-level detector, to said predetermined threshold and providing an attenuation flag signal in response thereto to said attenuator, said sixth means including a comparator, said comparator being associated with one or more latches configured so that attenuation occurs at particular intervals corresponding to clock cycles during which said predetermined threshold has been exceeded as indicated by said attenuation flag; and fourth means for employing said attenuation information to selectively adjust an output signal of a circuit connected between said third means and fifth means to accommodate effects that attenuation of said input signal by said third means has on said output signal.

11. The invention of claim 10 wherein said means for effecting said attenuation includes a comparator coupled to compare said signal level indication to a threshold and provide an output in response thereto.

12. The invention of claim 11 wherein said means for effecting said attenuation includes a latch coupled to the output of said comparator.

* * * * *